United States Patent
Sackrison et al.

(10) Patent No.: US 7,125,734 B2
(45) Date of Patent: Oct. 24, 2006

(54) INCREASED LIGHT EXTRACTION FROM A NITRIDE LED

(75) Inventors: Michael J. Sackrison, Bethlehem, PA (US); Hari S. Venugopalan, Somerset, NJ (US); Xiang Gao, Edison, NJ (US)

(73) Assignee: GELcore, LLC, Valley View, OH (US)

( * ) Notice: Subject to any disclaimer, the term of this patent is extended or adjusted under 35 U.S.C. 154(b) by 0 days.

(21) Appl. No.: 11/075,974

(22) Filed: Mar. 9, 2005

(65) Prior Publication Data

US 2006/0202223 A1     Sep. 14, 2006

(51) Int. Cl.
*H01L 21/00* (2006.01)
(52) U.S. Cl. .......................... 438/25; 438/26; 438/27; 438/33; 438/34; 438/35; 438/38; 438/41; 257/E33.057
(58) Field of Classification Search ............ 438/25–27, 438/33–35, 38, 41; 250/239; 257/80–85, 257/E33.057
See application file for complete search history.

(56) References Cited

U.S. PATENT DOCUMENTS

| | | |
|---|---|---|
| 3,739,217 A | 6/1973 | Bergh et al. |
| 5,244,818 A | 9/1993 | Jokerst et al. |
| 5,286,335 A | 2/1994 | Drabik et al. |
| 5,376,580 A | 12/1994 | Kish et al. |
| 5,773,369 A | 6/1998 | Hu et al. |
| 6,071,795 A | 6/2000 | Cheung et al. |
| 6,133,589 A | 10/2000 | Krames et al. |
| 6,248,600 B1 | 6/2001 | Bruce et al. |
| 6,280,523 B1 | 8/2001 | Coman et al. |
| 6,320,206 B1 | 11/2001 | Coman et al. |
| 6,335,263 B1 | 1/2002 | Cheung et al. |
| 6,420,242 B1 | 7/2002 | Cheung et al. |
| 6,559,075 B1 | 5/2003 | Kelly et al. |
| 6,740,604 B1 | 5/2004 | Kelly et al. |
| 6,746,889 B1 | 6/2004 | Eliashevich et al. |
| 6,831,302 B1 | 12/2004 | Erchak et al. |
| 6,974,758 B1 | 12/2005 | Kelly et al. |
| 2005/0023550 A1 | 2/2005 | Eliashevich et al. |
| 2006/0040468 A1 | 2/2006 | Kelly et al. |

FOREIGN PATENT DOCUMENTS

| | | |
|---|---|---|
| DE | 19640594 | 2/1998 |
| EP | 0785580 | 1/1997 |
| JP | 11-263284 | 9/1999 |

(Continued)

OTHER PUBLICATIONS

"Room-temperature photoenhanced wet etching of GaN" by M.S. Minsky, M. White and E.L. Hu; Applied Physics Letters of American Institute of Physics, vol. 68, No. 11, Mar. 11, 1996.

(Continued)

*Primary Examiner*—George Fourson
*Assistant Examiner*—Thanh V. Pham
(74) *Attorney, Agent, or Firm*—Fay, Sharpe, Fagan, Minnich & McKee, LLP

(57) ABSTRACT

In a method for fabricating a flip-chip light emitting diode device, a submount wafer is populated with a plurality of the light emitting diode dies. Each device die is flip-chip bonded to the submount. Subsequent to the flip-chip bonding, a growth substrate is removed. The entire submount is immersed in the etchant solution, exposed to the light for a prespecified period of time, removed from the solution, dried and diced into a plurality of LEDs. The LEDs are immediately packaged without any further processing.

14 Claims, 5 Drawing Sheets

FOREIGN PATENT DOCUMENTS

| WO | PCT/DE00/04269 | 11/2000 |
| WO | PCT/US00/33366 | 12/2000 |
| WO | PCT/US00/35303 | 12/2000 |
| WO | PCT/EP01/00774 | 1/2001 |
| WO | PCT/US01/02544 | 1/2001 |
| WO | PCT/DE01/00600 | 2/2001 |
| WO | PCT/US01/40358 | 3/2001 |
| WO | PCT/EP01/03846 | 4/2001 |
| WO | PCT/JP01/03947 | 5/2001 |
| WO | WO 01/70005 | 9/2001 |

OTHER PUBLICATIONS

"Increase in the extraction efficiency of GaN-based light-emitting diodes via surface roughening" by T. Fujii, Y. Gao, R. Sharma, E.L. Hu, S.P. DenBaars and S. Nakamura; Applied Physics Letters of American Institute of Physics, vol. 84, No. 6, Feb. 9, 2004.

Product Specifications, "Silicon Carbide Substrates," Cree Materials, pp. 1-5, Effective Dec. 1998—Revised Mar. 2003, Version MAT-CATALOG.000.

INCREASED LIGHT EXTRACTION FROM A NITRIDE LED

BACKGROUND

The present application relates to the electronics arts. It particularly relates to group III-nitride flip-chip bonded light emitting diodes for lighting applications, and will be described with specific reference thereto. However, it also finds application in conjunction with other types of flip-chip bonded epitaxial semiconductor devices, and the like.

In a flip-chip mounting configuration, a light emitting diode with a light-transmissive substrate and front-side electrodes is bonded "face down" to bonding bumps of a mount, that is, with the epitaxial layers proximate to the mount and a light-transmissive substrate distal from the mount. The flip-chip arrangement has a number of advantages, including improved thermal heat sinking due to the proximity of the active layers to the submount, and reduction of electrode shadowing losses.

In the flip-chip mounting configuration, light is extracted from the substrate side. For epitaxially grown light emitting diodes, the choices for substrate material can be highly restricted since the substrate is selected principally to provide a good base for the epitaxy. Thus, the substrate criteria include a narrow lattice constant range, a substantially atomically flat surface for nucleation of epitaxy, thermal stability at epitaxial growth temperatures, chemical compatibility with the epitaxial process, and so forth.

A problem can arise in the flip-chip configuration when the growth substrate is substantially light-absorbing over some or all of the spectral range of light emission. In this case, light extraction is reduced due to light absorption losses in the substrate. Moreover, even if a suitable optically transparent substrate is available, such as is the case for group III-nitride light emitting diodes which can be grown on transparent sapphire, optical reflective losses can occur at the interface between the substrate and the epitaxial layers due to an abrupt discontinuity in refractive index. Accordingly, it can be advantageous to remove the substrate to decrease optical losses.

However, the sapphire substrate serves as a lens which can improve the light extraction from the chip. Additionally, the GaN layer, which is exposed by the removal of the sapphire substrate, has a very smooth surface which results in a wave-guide effect. As a result, while the removal of the sapphire substrate from a nitride-based flip chip provides the above benefit, it also causes a significant degradation of the light output power of the LED chip.

It has been proposed to roughen the exposed layer of the GaN film to improve the light extraction. Some commonly used methods include dry etching the exposed layer such as reactive ion etching. However, dry etching has a possibility of damaging the chip and involves high costs. It also might etch and redeposit the underfill material that is typically used to support the GaN film after the substrate is removed. Another method commonly used is wet etching. The problem with wet etching is that GaN is not easily etched by most solutions and if it can be etched, the etch rate is too slow for effective processing. Another method used is photoelectrochemical etching which uses light and electronic bias to assist the etchant solution and speed up the wet etching. However, photoelectrochemical etching requires a complex setup to provide an electric potential over the surface being etched and deposit metal on GaN film that serves as an electrical contact. Furthermore, the LED chip must undergo additional processing both before and after the etching step.

BRIEF DESCRIPTION

In accordance with one aspect of the present application, a method for fabricating the flip-chip light emitting diode chip is provided. Epitaxial layers are deposited on a growth substrate to produce an epitaxial wafer. A plurality of light emitting diode devices is fabricated on the epitaxial wafer. The epitaxial wafer is diced to generate a plurality of light emitting diode device dies. The device dies are flip-chip bonded to a mount by securing the device dies to the mount by bonding at least one electrode of each device die to at least one bonding pad of the mount. Subsequent to the flip-chip bonding of the device dies, the growth substrate is removed. The exposed epitaxial layer is roughened by a photochemical etching in the absence of a bias.

In accordance with another aspect of the present application, a lateral current flip-chip light emitting diode device with a removed growth substrate is provided. The light emitting diode device includes a mount including bonding pads. A die active side is bonded to bonding bumps of the mount to securely fasten the active side to the mount. An underfill material is arranged between the active side and the mount. The underfill material supports the die and prevents the die from fracturing. A plurality of irregularities is formed on an exposed top surface of the layers stack defining a roughened top surface which improves light extraction by scattering the emitted light outward.

BRIEF DESCRIPTION OF THE DRAWINGS

The invention may take form in various components and arrangements of components, and in various process operations and arrangements of process operations. The drawings are only for purposes of illustrating preferred embodiments and are not to be construed as limiting the invention.

DETAILED DESCRIPTION

Figure 1:
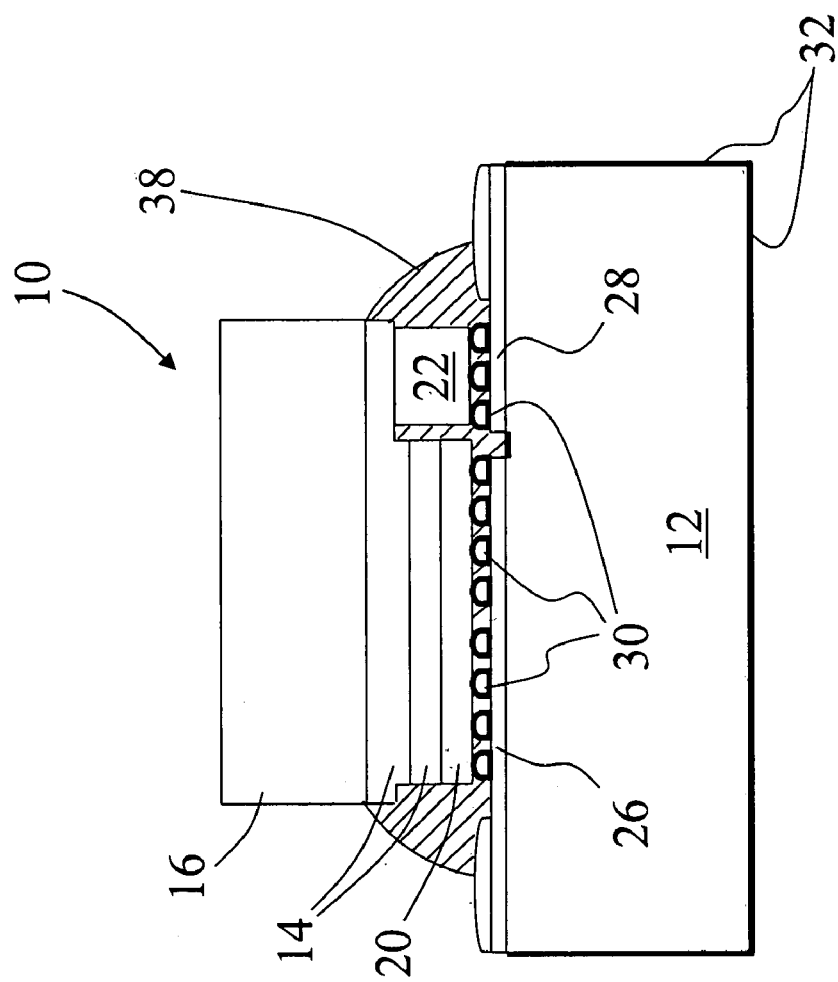
FIG. 1 shows a cross-sectional view of a light emitting diode dice flip chip bonded to a mount.

With reference to FIG. 1, a light emitting die 10 is mounted in flip-chip fashion on a mount or submount wafer 12. The die 10 includes a semiconductor device layers stack 14 that is epitaxially deposited on a growth substrate 16. The epitaxial device layers stack 14 can comprise a group III nitride ultraviolet or blue light material, a group III phosphide visible-emission material, or the like.

The semiconductor layers stack 14 is depicted with two exemplary layers corresponding to a simple p/n diode; however, those skilled in the art will appreciate that more complex semiconductor layer stack can be employed. For a group III nitride ultraviolet or blue light emitting diode with a p-on-n orientation, the layers stack typically includes an epitaxial growth buffer of aluminum nitride or another material, an n-type gallium nitride base layer, an active region of indium gallium nitride, a p-type gallium nitride layer, and optionally a contact layer formed on the p-type gallium nitride layer. Those skilled in the art can readily construct other semiconductor epitaxial layers stacks that are suitable for specific optical applications.

The growth substrate 16 is typically formed of a crystalline material that is suitable for epitaxial growth of the selected semiconductor layers stack 14. One exemplary growth substrate is sapphire. Those skilled in the art can readily select a growth substrate having a suitable surface lattice constant, a large-area planar surface, and appropriate thermal and chemical characteristics for promoting high quality, preferably lattice-matched epitaxial growth of the selected semiconductor layers stack 14.

Epitaxial deposition of the semiconductor layers stack 14 on the selected growth substrate 16 can be by metal-organic chemical vapor deposition (MOCVD; also known in the art as organometallic vapor-phase epitaxy, OMVPE, and similar nomenclatures), molecular beam epitaxy (MBE), liquid phase epitaxy (LPE), or another suitable epitaxial growth technique. As with the growth substrate 16, the choice of epitaxial growth technique is made based on the type of epitaxial layer stack 14 that is to be grown.

The epitaxial deposition is performed over a large-area substrate wafer. The large-area substrate wafer with the epitaxial layers stack 14 deposited thereupon is referred to herein as an epitaxial wafer. The epitaxial wafer is processed using a suitable fabrication process including sub-processes such as wafer cleaning, lithography, etching, dielectric deposition, metallization, and the like to define a plurality of light emitting diode devices on the wafer. In a typical approach, the fabrication process includes initial wafer cleaning, lithographic definition and etching of device mesas, and lithographic definition and formation of n-type and p-type electrodes.

With continuing reference to FIG. 1, the die 10 is a lateral current flow geometry device, and includes a p-type electrode 20 disposed on the device mesa and an n-type electrode 22 disposed in a field area off the device mesa. In this embodiment, both electrodes 20, 22 are front-side electrodes. Exemplary electrodes 20, 22 are made of gold or have gold coatings for facilitating low-resistance electrical contact.

The mount 12 includes a first bonding pad 26 arranged to connect with the p-type electrode 20, and a second bonding pad 28 arranged to connect with the n-type electrode 22. A plurality of bonding bumps 30 are arranged on the bonding pads 26, 28. The light emitting diode device dies 10 are flip chip bonded to the bonding pads 26, 28 of the mount 12, and more specifically bonded to the bonding bumps 30, which, in one embodiment, are 10 micron bumps. Flip chip bonding can be achieved by soldering, in which case the bonding bumps 30 are solder bumps. Alternatively, flip chip bonding can be achieved by thermosonic bonding, in which case the bumps are preferably gold-coated copper bumps that are bonded to the gold of the electrodes 20, 22 by a combination of heating and injection of ultrasonic energy. Other bonding methods can also be employed. The mount 12 includes a dielectric material layer 32 which covers all the areas with the exception of the bumps 30, bonding pads 26, 28 and solderable backside metal (not shown). The bumps 30, bonding pads 26, 28 and solderable backside metal are terminated with a material, such as gold, which does not etch in the etchant solution.

After the bonding, an underfill material 38 is preferably disposed between the light emitting device die and the mount to provide mechanical support, protect the mount and the chip from the etchant solution, improve securing of the device die to the mount, and provide optional encapsulation and improved heat sinking. The support provided by the underfill material 38 is distributed across the area of the light emitting diode device 10 to provide support at or proximate to localized stress regions such as at or around the bonding bumps 30. The underfill material 38 is preferably applied as a fluid and then cured or dried before or after bonding.

The underfill material 38 is preferably an epoxy, silicone, photoresist, or other material that can be applied in a liquid or flowable form and then cured or dried. In the case of group III-nitride light emitting diode devices that emit blue or ultraviolet light, a wavelength converting phosphor can be incorporated into the underfill material 38 to convert the blue or ultraviolet light into white light or light having other selected spectral characteristics. Such phosphor incorporation is most beneficial in devices that employ a lateral current flow geometry, such as the light emitting diode device die 10, since in such geometry a substantial amount of light leaks toward the mount 12 through sidewalls of the etched mesa.

Figure 2:
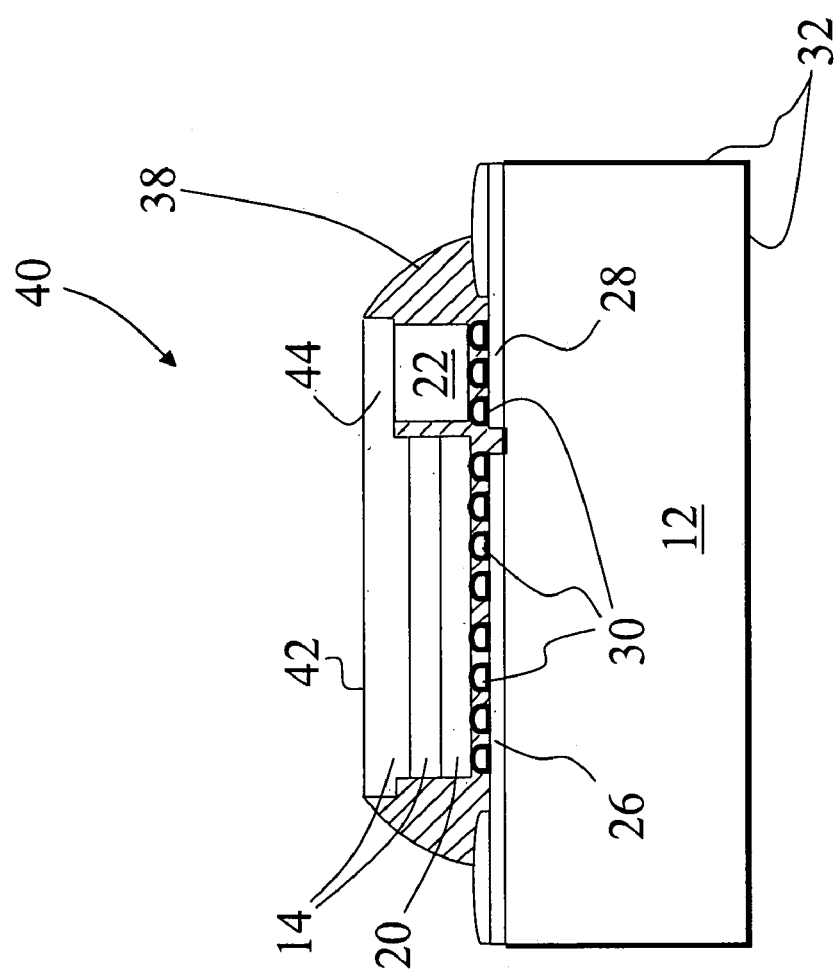
FIG. 2 shows a cross-sectional view of a light emitting diode dice flip chip bonded to a mount after removal of substrate.

With reference to FIG. 2, the substrate 16 is removed to produce the modified flip chip light emitting diode die 40. A top surface 42 of an exposed layer 44 is cleaned to produce a smooth GaN film.

Figure 3:
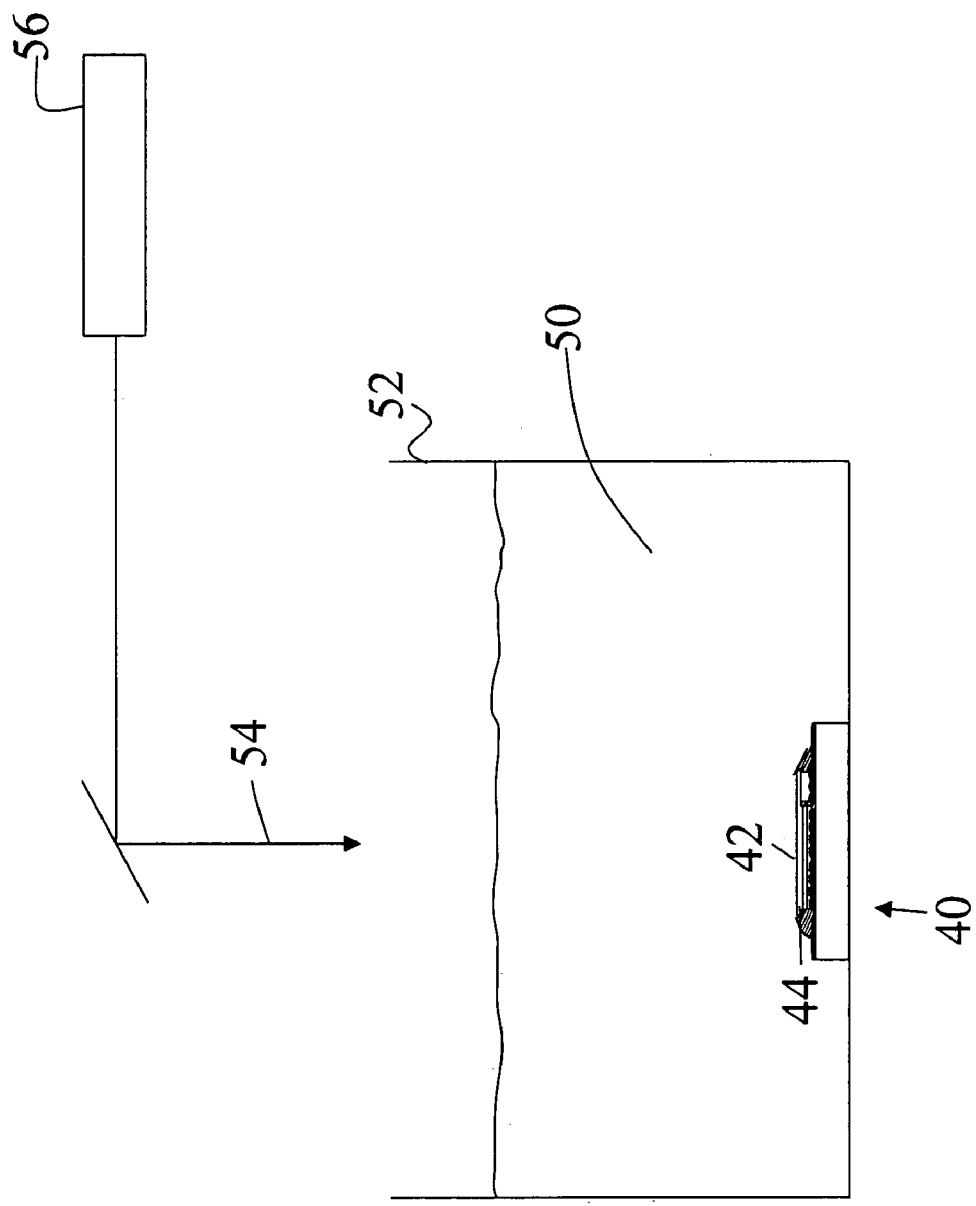
FIG. 3 shows an etching process.
Figure 4:
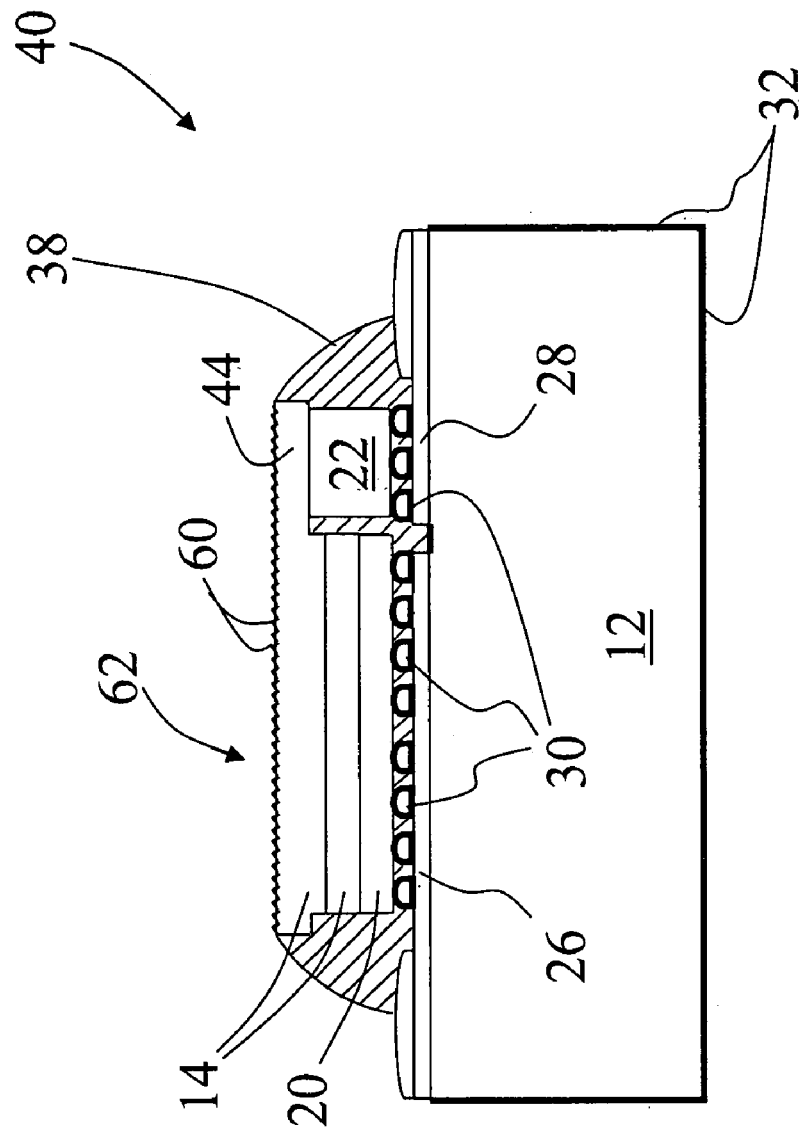
FIG. 4 shows a cross-sectional view of a light emitting diode dice with a roughened top surface.

With reference to FIGS. 3 and 4, the modified light emitting diode die 40 is immersed in an etchant solution 50 of a container 52 at a room temperature to form a plurality of microstructures 60. The etchant solution 50 can be any etchant solution, choice of which is made based on the type of epitaxial layer that is to be etched and on desired etch rate. In one embodiment, the etchant solution 50 is a solution of a straight 45% KOH. A light 54 from a light source 56 is shined through the container 52 directly onto the top surface 42 of the exposed layer 44. The light energy of the light source 56 assists the etchant solution 50 in etching the top surface 42 of the exposed layer 44 which results in creating holes, bumps and the like irregularities in the top surface 42. The light energy of the light source 56 is above the bandgap energy of the exposed layer 44, e.g. the light source 56 is selected such that the exposed layer can be etched. In one embodiment, the light 54 is an ultraviolet light from a KrF excimer laser operating at 248 nm and 500 Hz.

After a predefined period of time t, the light emitting diode die 40 is removed from the etchant solution 50. As best seen in FIG. 4, the microstructures 60 define a roughened surface 62 that is formed about the top surface 42 of the exposed layer 44. The roughened top surface 62 reduces internal light reflection and scatters the light outward, thus substantially improving light extraction. The light emitting diode die 40 is rinsed with DI water, dried, and packaged without any further processing.

Figure 5:
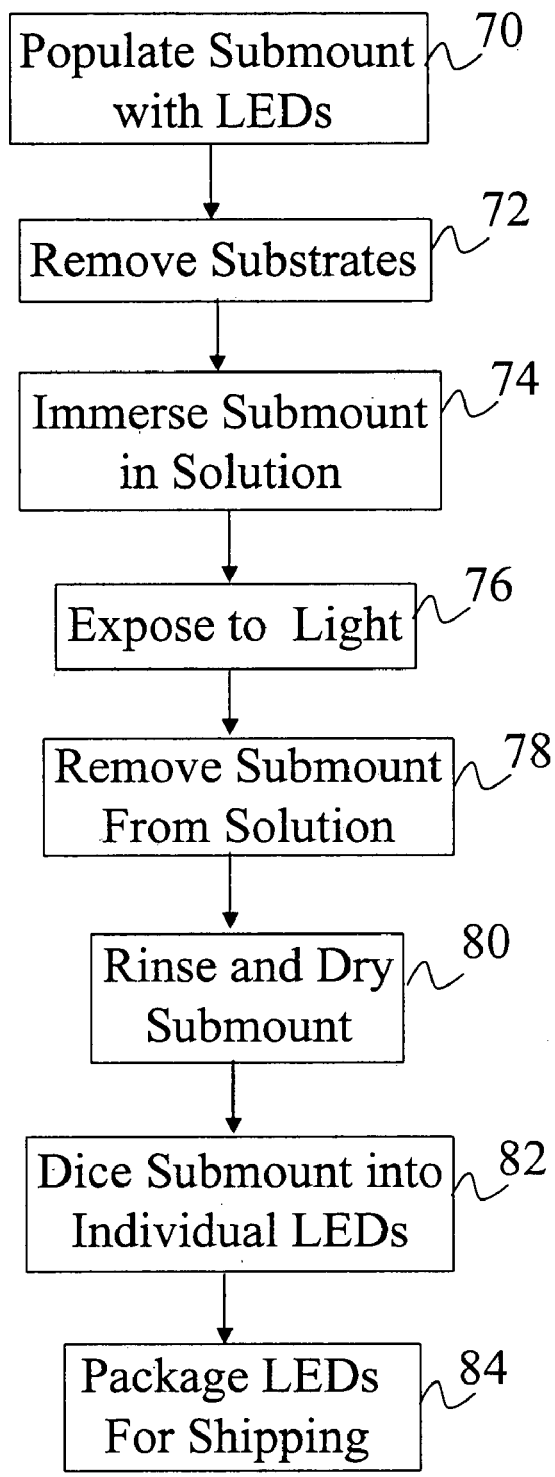
FIG. 5 shows a method steps of fabricating light emitting diode chips in accordance with the present application.

With reference to FIG. 5, the submount wafer is populated 70 with a plurality of the light emitting diode dies 10. After the substrates are removed 72, the entire submount is immersed 74 in the etchant solution 50, exposed to the light 76, removed from the solution 78, dried 80, diced 82 into the plurality of LEDs which are immediately packaged 84 without any further processing in accordance with the process described above. The additional steps used in photochemical etching such as creating electrical potential over the exposed layer and depositing a metal on the exposed layer to provide electrical contacts are eliminated. The exposed layer is roughened after the device has been fully processed. Roughening the n-GaN at this stage of the processing reduces the risk of damaging the exposed device and eliminates the need for using photolithography to define metal regions or contacts, additional dry etching, and metal deposition steps.

The exemplary embodiment has been described with reference to the preferred embodiments. Obviously, modifications and alterations will occur to others upon reading and understanding the preceding detailed description. It is intended that the exemplary embodiment be construed as including all such modifications and alterations insofar as they come within the scope of the appended claims or the equivalents thereof.

The invention claimed is:

1. A method for fabricating a light emitting device comprising:
   depositing epitaxial layers on a growth substrate to produce an epitaxial wafer;
   fabricating a plurality of light emitting diode devices with a lateral current flow geometry on the epitaxial wafer;
   dicing the epitaxial wafer to generate a plurality of light emitting dies;
   flip chip bonding at least one electrode of one or more die to at least one bonding pad of a mount;
   subsequent to bonding of the dies, removing the growth substrate to expose an epitaxial layer; and
   roughening the epitaxial layer by electrode-less photochemical etching.

2. The method as set forth in claim 1, wherein the step of roughening includes:
   immersing the mount carrying the device dies in a chemical solution for a prespecified time period; and
   concurrently illuminating the immersed exposed epitaxial layer with a light source.

3. The method as set forth in claim 2, further including:
   removing the mount carrying the device dies from the chemical solution;
   rinsing the mount carrying the device dies with water;
   drying the mount carrying the device dies;
   dicing the mount to generate a plurality of light emitting diode chips; and
   packaging the light emitting diode chips.

4. The method as set forth in claim 2, wherein the chemical etching includes:
   selecting a chemical etchant that etches the exposed layer to produce a plurality of microstructures about a top surface of the exposed layer.

5. The method as set forth in claim 2, wherein the chemical solution has ambient temperature.

6. The method as set forth in claim 2, wherein the chemical solution is at least one of:
   Potassium Hydroxide, and
   Hydrochloric Acid.

7. The method as set forth in claim 2, wherein the light source includes frequencies above the bandgap of the exposed epitaxial layer, the light source being at least one of:
   a laser light;
   a mercury-xenon arc lamp;
   a mercury arc lamp; and
   a UV light.

8. The method as set forth in claim 1, further including:
   cleaning the exposed epitaxial layer prior to roughening.

9. The method as set forth in claim 1, further including:
   deposing an underfill material at least between the mount and the flip chip bonded device die.

10. The method as set forth in claim 9, further including:
    deposing a phosphor in the underfill material.

11. The method as set forth in claim 9, wherein the underfill material is selected to have a thermal expansion coefficient matching one of a thermal expansion coefficient of the device die, a thermal expansion coefficient of the mount, and a thermal expansion coefficient value intermediate between the thermal expansion coefficients of the device die and the mount.

12. The method as set forth in claim 1, wherein the epitaxial layers include group III-nitride compound semiconductor layers.

13. The method as set forth in claim 12, wherein the growth substrate is a sapphire substrate.

14. A method for fabricating a Group III Nitride semiconductor lateral current light emitting diode device comprising:
    depositing epitaxial layers on a growth substrate to produce an epitaxial wafer;
    fabricating a plurality of light emitting diode devices on the epitaxial wafer;
    dicing the epitaxial wafer to generate a plurality of light emitting diode device dies, each including laterally disposed first and second electrodes;
    flip chip bonding the device dies to a mount, the flip chip bonding including securing the device dies to the mount by bonding the first and second electrodes of each device die to corresponding bonding pads of the mount;
    subsequent to the flip chip bonding of the device dies, removing the growth substrate to expose an epitaxial layer;
    roughening the exposed epitaxial layer being exposed by the substrate removal by electrode-less photochemical etching without applying a bias, including:
       immersing the mount, carrying the device dies, in a chemical solution for a prespecified time period, and
       concurrently illuminating the immersed exposed epitaxial layer with a light source;
    removing the mount carrying the device dies from the chemical solution;
    rinsing the mount carrying the device dies;
    drying the mount carrying the device dies;
    dicing the mount to generate a plurality of light emitting diode chips; and
    packaging the light emitting diode chips.

* * * * *